United States Patent
Sarwar et al.

(10) Patent No.: US 11,731,284 B2
(45) Date of Patent: Aug. 22, 2023

(54) SYSTEM AND METHOD FOR FABRICATING SOFT SENSORS THAT CONFORM TO ARBITRARY SMOOTH GEOMETRIES

(71) Applicant: Honda Motor Co., Ltd., Tokyo (JP)

(72) Inventors: Mirza Saquib Sarwar, San Jose, CA (US); Katsu Yamane, Mountain View, CA (US); Ryusuke Ishizaki, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 359 days.

(21) Appl. No.: 17/174,226

(22) Filed: Feb. 11, 2021

(65) Prior Publication Data

US 2022/0219333 A1  Jul. 14, 2022

Related U.S. Application Data

(60) Provisional application No. 63/136,428, filed on Jan. 12, 2021.

(51) Int. Cl.
*B25J 13/00* (2006.01)
*B25J 13/08* (2006.01)
*G03F 7/00* (2006.01)

(52) U.S. Cl.
CPC .......... *B25J 13/084* (2013.01); *G03F 7/0035* (2013.01)

(58) Field of Classification Search
CPC ............................. B25J 13/084; G03F 7/0035
See application file for complete search history.

(56) References Cited

U.S. PATENT DOCUMENTS

| | | | |
|---|---|---|---|
| 1,155,753 A * | 10/1915 | MacKenzie | C01C 1/242 423/550 |
| 10,831,319 B2 | 11/2020 | Madden et al. | |
| 2018/0073942 A1 | 3/2018 | Wu et al. | |
| 2018/0238716 A1* | 8/2018 | Madden | G01L 1/146 |
| 2018/0246594 A1 | 8/2018 | Madden et al. | |
| 2020/0064948 A1 | 2/2020 | Chang | |
| 2020/0125817 A1 | 4/2020 | Kim et al. | |
| 2021/0318768 A1 | 10/2021 | Fang et al. | |
| 2022/0087008 A1 | 3/2022 | Sano | |
| 2022/0214232 A1 | 7/2022 | Ishizaki et al. | |
| 2022/0221349 A1 | 7/2022 | Ishizaki et al. | |
| 2022/0228937 A1 | 7/2022 | Ishizaki et al. | |

OTHER PUBLICATIONS

Office Action of U.S. Appl. No. 17/218,800 dated Jan. 13, 2023, 23 pages.

(Continued)

*Primary Examiner* — Jamel E Williams
(74) *Attorney, Agent, or Firm* — Rankin, Hill & Clark LLP

(57) ABSTRACT

A system and method for fabricating soft sensors that conform to arbitrary smooth geometries that include fabricating a top stretchable layer that includes a set of electrodes of soft sensors that are made of an elastic material. The system and method also include fabricating a bottom flexible layer that is composed of a thin sheet of suitable metal that is patterned using photolithography. The system and method further include bonding the top stretchable layer to the bottom flexible layer to form a sensor substrate.

20 Claims, 9 Drawing Sheets

(56) References Cited

OTHER PUBLICATIONS

K. S. Karimov, M. Saleem, Z. M. Karieva, A. Khan, T. A. Qasuria, and A. Mateen, "A carbon nanotube-based pressure sensor," Phys. Scr., vol. 83, No. 6, p. 065703, Jun. 2011, doi: 10 1088/0031-8949/83/06/065703.
B. Li, A. K. Fontecchio, and Y. Visell, "Mutual capacitance of liquid conductors in deformable tactile sensing arrays," Appl. Phys. Lett., vol. 108, No. 1, p. 013502, Jan. 2016, doi: 10.1063/1.4939620.
S. Ma et al., "Fabrication of Novel Transparent Touch Sensing Device via Drop-on-Demand Inkjet Printing Technique," ACS Appl. Mater. Interfaces, vol. 7, No. 39, pp. 21628-21633, Oct. 2015, doi: 10.1021/acsami.5b04717.
K. Altun and K. E. MacLean, "Recognizing affect in human touch of a robot," Pattern Recognition Letters, vol. 66, pp. 31-40, 2015.
B. D. Argali and A. G. Billard, "A survey of tactile human-robot interactions," Robotics and autonomous systems, vol. 58, No. 10, pp. 1159-1176, 2010.
T. Balli Altuglu and K. Altun, "Recognizing touch gestures for social human-robot interaction," in Proceedings of the 2015 ACM on International Conference on Multimodal Interaction, 2015, pp. 407-413.
M. D. Dickey, "Stretchable and soft electronics using liquid metals," Advanced Materials, vol. 29, No. 27, p. 1606425, 2017.
D. Goeger, M. Blankertz, and H. Woern, "A tactile proximity sensor," in Sensors, 2010 IEEE. IEEE, 2010, pp. 589-594.
M. J. Hertenstein, R. Holmes, M. McCullough, and D. Keltner, "The communication of emotion via touch." Emotion, vol. 9, No. 4, p. 566, 2009.
M. Kanamori, M. Suzuki, H. Oshiro, M. Tanaka, T. Inoguchi, H. Takasugi, Y. Saito, and T. Yokoyama, "Pilot study on improvement of quality of life among elderly using a pet-type robot," in Proceedings 2003 IEEE International Symposium on Computational Intelligence in Robotics and Automation. Computational Intelligence in Robotics and Automation for the New Millennium (Cat. No. 03EX694), vol. 1. IEEE, 2003, pp. 107-112.
H.-K. Lee, S.-I. Chang, and E. Yoon, "Dual-mode capacitive proximity sensor for robot application: Implementation of tactile and proximity sensing capability on a single polymer platform using shared electrodes," IEEE sensors journal, vol. 9, No. 12, pp. 1748-1755, 2009.
T. Tajika, T. Miyashita, H. Ishiguro, and N. Higata, "Automatic categorization of haptic interactions—what are the typical haptic interactions between a human and a robot?" in 2006 6th IEEE-RAS International Conference on Humanoid Robots. IEEE, 2006, pp. 490-496.
Y. Vladimirsky, "10. lithography," in Vacuum Ultraviolet Spectroscopy II, ser. Experimental Methods in the Physical Sciences, J. Samson and D. Ederer, Eds. Academic Press, 1998, vol. 32, pp. 205-223. [Online]. Available: https://www.sciencedirect.com/science/article/pii/S0076695X08602835.
M. L. Hammock, A. Chortos, B. C.-K. Tee, J. B.-H. Tok, and Z. Bao, "25th anniversary article: The evolution of electronic skin (e-skin): a brief history, design considerations, and recent progress," Adv. Mater., vol. 25, No. 42, pp. 5997-6038, Nov. 2013, doi: 10.1002/adma.201302240.
W. Jillek and W. K. C. Yung, "Embedded components in printed circuit boards: A processing technology review," Int. J. Adv. Manuf. Technol., vol. 25, No. 3-4, pp. 350-360,2005, doi: 10.1007/s00170-003-1872-y.
S. Park, H. Kim, M. Vosgueritchian, S. Cheon, H. Kim, J. H. Koo, T. R. Kim, S. Lee, G. Schwartz, H. Chang et al., "Stretchable energy-harvesting tactile electronic skin capable of differentiating multiple mechanical stimuli modes," Advanced Materials, vol. 26, No. 43, pp. 7324-7332, 2014.
S. Sharma, A. Chhetry, S. Ko, and J. Y. Park, "Polymer-Mxene Composite Nanofiber Mat for Wearable Health Mionitoring," No. 20 ml, pp. 810-813, 2020.
D. Silvera-Tawil, D. Rye, and M. Velonaki, "Arlificial skin and tactile sensing for socially interactive robots: A review," Rob. Auton. Syst., vol. 63, pp. 230-243, Jan. 2015, doi: 10.1016/J.ROBOT.2014.09.008.
D. Hughes, A. Krauthammer, and N. Correll, "Recognizing social touch gestures using recurrent and convolutional neural networks," in 2017 IEEE International Conference on Robotics and Automation (ICRA). IEEE, 2017, pp. 2315-2321.
G. Zhu, L. Zhang, P. Shen, J. Song, S. A. A. Shah, and M. Bennamoun, "Continuous gesture segmentation and recognition using 3dcnn and convolutional lstm," IEEE Transactions on Multimedia, vol. 21, No. 4, pp. 1011-1021, 2018.
Notice of Allowance of U.S. Appl. No. 17/385,524 dated Sep. 20, 2022, 16 pages.
Office Action of U.S. Appl. No. 17/218,800 dated Sep. 21, 2022, 37 pages.
M. D. Cooney, S. Nishio, and H. Ishiguro, "Recognizing affection for a touch-based interaction with a humanoid robot," in 2012 IEEE/RSJ International Conference on Intelligent Robots and Systems. IEEE, 2012, pp. 1420-1427.
M. Cooney, S. Nishio, and H. Ishiguro, "Affectionate interaction with a small humanoid robot capable of recognizing social touch behavior," ACM Trans. Interact. Intell. Syst., vol. 4, No. 4, Dec. 2014. [Online]. Available: https://doi.org/10.1145/2685395.
F. A. Gers, N. N. Schraudolph, and J. Schmidhuber, "Learning precise timing with lstm recurrent networks," Journal of machine learning research, vol. 3, No. Aug, pp. 115-143, 2002.
M. Heerink, B. Kröse, B. Wielinga, and V. Evers, "Enjoyment intention to use and actual use of a conversational robot by elderly people," in Proceedings of the 3rd ACM/IEEE international conference on Human robot interaction, 2008, pp. 113-120.
S. Hochreiter and J. Schmidhuber, "Long short-term memory," Neural computation, vol. 9, No. 8, pp. 1735-1780, 1997.
W. Hu, X. Niu, R. Zhao, and Q. Pei, "Elastomeric transparent capacitive sensors based on an interpenetrating composite of silver nanowires and polyurethane," Applied Physics Letters, vol. 102, No. 8, p. 38, 2013.
K.-H. Huang, F. Tan, T.-D. Wang, and Y.-J. Yang, "A highly sensitive pressure-sensing array for blood pressure estimation assisted by machine-learning techniques," Sensors, vol. 19, No. 4, p. 848, 2019.
M. M. Jung, M. Poel, R. Poppe, and D. K. Heylen, "Automatic recognition of touch gestures in the corpus of social touch," Journal on multimodal user interfaces, vol. 11, No. 1, pp. 81-96, 2017.
J. Kim, A. Alspach, I. Leite, and K. Yamane, "Study of children's hugging for interactive robot design," in 2016 25th EEE International Symposium on Robot and Human Interactive Communication (ROMAN) IEEE, 2016, pp. 557-561.
A. E. Kubba, A. Hasson, A. I. Kubba, and G. Hall, "A microcapacitive pressure sensor design and modelling," Journal of Sensors and Sensor Systems, vol. 5, No. 1, pp. 95-112, 2016.
S. H. Lee, J. H. Lee, C. Park, and M. K. Kwak, "Roll-type photolithography for continuous fabrication of narrow bus vires," Journal of Micromechanics and Microengineering, vol. 26, No. 11, p. 115008, 2016.
S. C. B. Mannsfeld et al., "Highly sensitive flexible pressure sensors with microstructured rubber dielectric layers," Nat. Mater., vol. 9, No. 10, pp. 859-864, Oct. 2010, doi: 10.1038/nmat2834.
A. Moin et al., "A wearable biosensing system with in-sensor adaptive machine learning for hand gesture recognition," Nat. Electron., doi: 10.1038/S41928-020-00510-8.
J.-H. Park, J.-H. Seo, Y.-H. Nho, and D.-S. Kwon, "Touch gesture recognition system based on 1d convolutional neural network with two touch sensor orientation settings," in 2019 16th International Conference on Ubiquitous Robots (UR). IEEE, 2019, pp. 65-70.
H. Shamkhalichenar, C. J. Bueche, and J. Choi, "Printed Circuit Board ( PCB ) Technology for Electrochemical Sensors and Sensing Platforms," 2020.
X. Shi, Z. Chen, H. Wang, D.-Y. Yeung, W.-K. Wong, and W.-c. Woo, "Convolutional lstm network: A machine learning approach for precipitation nowcasting," arXiv preprint arXiv:1506.04214, 2015.

(56) References Cited

OTHER PUBLICATIONS

C. B. Thoresen and U. Hanke, "Numerical simulation of mutual capacitance touch screens for ungrounded objects," IEEE Sensors Journal, vol. 17, No. 16, pp. 5143-5152, 2017.
M. Valero et al., "Interfacial pressure and shear sensor system for fingertip contact applications.," Healthc. Technol. Lett., vol. 3, No. 4, pp. 280-283, Dec. 2016, doi: 10.1049/htl.2016.0062.
G. Walker, "A review of technologies for sensing contact location on the surface of a display," J. Soc. Inf. Disp., vol. 20, No. 8, p. 413-440, Aug. 2012, doi: 10.1002/jsid.100.
X. Wang, T. Li, J. Adams, and J. Yang, "Transparent, stretchable, carbon-nanotube-inlaid conductors enabled by standard replication technology for capacitive pressure, strain and touch sensors," J. Mater. Chem. A, vol. 1, No. 11, p. 3580, 2013, doi: 10.1039/c3ta00079f.
B. Zhuo, S. Chen, M. Zhao, and X. Guo, "High Sensitivity Flexible Capacitive Pressure Sensor Using Polydimethylsiloxane Elastomer Dielectric Layer Micro-Structured by 3-D Printed Mold," IEEE J. Electron Devices Soc., vol. 5, No. 3, pp. 219-223, May 2017, doi: 10.1109/JEDS.2017.2683558.

\* cited by examiner

SYSTEM AND METHOD FOR FABRICATING SOFT SENSORS THAT CONFORM TO ARBITRARY SMOOTH GEOMETRIES

CROSS-REFERENCE TO RELATED APPLICATION

This application claims priority to U.S. Provisional Application Ser. No. 63/136,428 filed on Jan. 12, 2021, which is expressly incorporated herein by reference.

BACKGROUND

The need for soft tactile sensors that conform to arbitrary smooth geometries has been a bottleneck for developing robot hands with dexterous manipulating capabilities. The field requires the sensor to be soft, skin-like, and to conform to the shape of a fingertip and/or a palm. Although, there has been significant development in the field of soft sensors, however, most of them are all in academia. In actual commercial applications several other requirements need to be met especially in the readout electronics segment. For example, adhering soft sensors for robotic purposes may often be a challenge and delamination is often an issue.

BRIEF DESCRIPTION

According to one aspect, a system for fabricating soft sensors that conform to arbitrary smooth geometries that includes a top stretchable layer that includes a set of electrodes of soft sensors that are made of an elastic material. The system also includes a bottom flexible layer that is composed of a thin sheet of suitable metal that is patterned using photolithography. The bottom flexible layer is configured to be in conformity with the arbitrary smooth geometries. The top stretchable layer is bonded to the bottom flexible layer to form a sensor substrate. The sensor substrate is configured as a stretchable adhesive film which enables robust adhesion to the arbitrary smooth geometries.

According to another aspect, a method for fabricating soft sensors that conform to arbitrary smooth geometries that includes fabricating a top stretchable layer that includes a set of electrodes of soft sensors that are made of an elastic material. The method also includes fabricating a bottom flexible layer that is composed of a thin sheet of suitable metal that is patterned using photolithography. The bottom flexible layer is configured to be in conformity with the arbitrary smooth geometries. The method further includes bonding the top stretchable layer to the bottom flexible layer to form a sensor substrate. The sensor substrate is configured as a stretchable adhesive film which enables robust adhesion to the arbitrary smooth geometries.

According to yet another aspect, a system for fabricating soft sensors that conform to arbitrary smooth geometries that includes a sensor substrate that is configured to as a stretchable adhesive film which enables robust adhesion to a robotic device that includes a top stretchable layer that includes a set of electrodes of soft sensors that are made of an elastic material. The sensor substrate also includes a bottom flexible layer that is composed of copper films that are patterned using photolithography.

BRIEF DESCRIPTION OF THE DRAWINGS

The novel features believed to be characteristic of the disclosure are set forth in the appended claims. In the descriptions that follow, like parts are marked throughout the specification and drawings with the same numerals, respectively. The drawing figures are not necessarily drawn to scale and certain figures can be shown in exaggerated or generalized form in the interest of clarity and conciseness. The disclosure itself, however, as well as a preferred mode of use, further objects and advances thereof, will be best understood by reference to the following detailed description of illustrative embodiments when read in conjunction with the accompanying drawings, wherein:

DETAILED DESCRIPTION

I. System Overview

Figure 1:
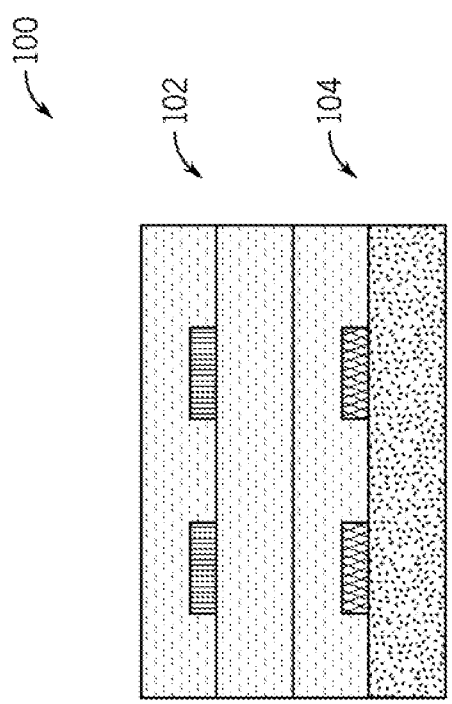
FIG. 1 is a cross-section view of a sensor substrate according to an exemplary embodiment of the present disclosure.

Referring now to the drawings, wherein the showings are for purposes of illustrating one or more exemplary embodiments and not for purposes of limiting same, FIG. 1 includes a cross-section of the sensor substrate 100 according to an exemplary embodiment of the present disclosure. In one embodiment, a fabrication system may be configured to fabricate the sensor substrate 100 that includes soft sensors to conform to arbitrary smooth geometries to provide a high mechanical robustness and a high level of electronic sensor signal integrity with respect to sensor signals output by the soft sensors.

The fabrication system may leverage the advantages of making devices/circuit boards and soft-sensor technology that enables the fabrication of state-of-the-art conformal tactile sensors. In one embodiment, a set of electrodes of soft sensors that may be bonded upon a sensor substrate may be made of flexible material that provides a conformity needed for proper robotic device sensing (e.g., robotic finger sensing) with conventional materials that are solder-able. This configuration may also provide an interface with readout electronics.

As described in more detail below, the fabrication system may be configured to utilize an additional set of top electrodes that may be made of stretchable conductor material that renders a top segment of the sensor as soft and compliant. The system may also be configured to form a bottom flexible layer 104 that may be composed of a thin sheet of suitable metal that is patterned using photolithography. In one embodiment, the thin sheet of suitable metal may include copper films that are patterned using photolithography. The bottom flexible layer 104 is configured to be in conformity with the arbitrary smooth geometries with smooth segments of small radii of curvatures, to which a high level of conformity may be achieved with a suitable copper film thickness and copper pattern size and shape.

Photolithography is known in the art to have also been implemented in fabricating passive electronic components such as surface mount resistors directly on the circuit boards. The fabrication system may use photolithography as a patterning process to provide a benefit of the process being easily scalable since it may be used to make features in the range of nanometers (used in microchips) all the way to centimeters or larger. Also, the device sizes fabricated using photolithography technology may be scaled all the way from a few millimeters in size to a few meters. The substrate for this fabrication process may be configured as a stretchable adhesive film which enables easy implementation and robust adhesion on a robotic device such as a robot finger/hand. Accordingly, the use of the fabrication method executed by the fabrication system and described in more detail below allows the fabrication of soft sensors that may easily interface with electronics and may provide mechanical and electrical integrity that may be required by a commercial grade product.

As shown in FIG. 1, the sensor substrate 100 may include a top stretchable layer 102 that may be bonded to a bottom flexible layer 104. A bottom portion of the sensor substrate 100 may be configured to include an adhesive portion, such that a bottom face of the bottom flexible layer 104 allows the sensor substrate 100 to robustly adhere one or more types of sensors to/upon any arbitrary geometry. As such, the sensor substrate 100 may be configured to adhere one or more types of sensors on robotic applications, such as robotic hands, fingers, and/or additional types of geometries.

Figure 2A:
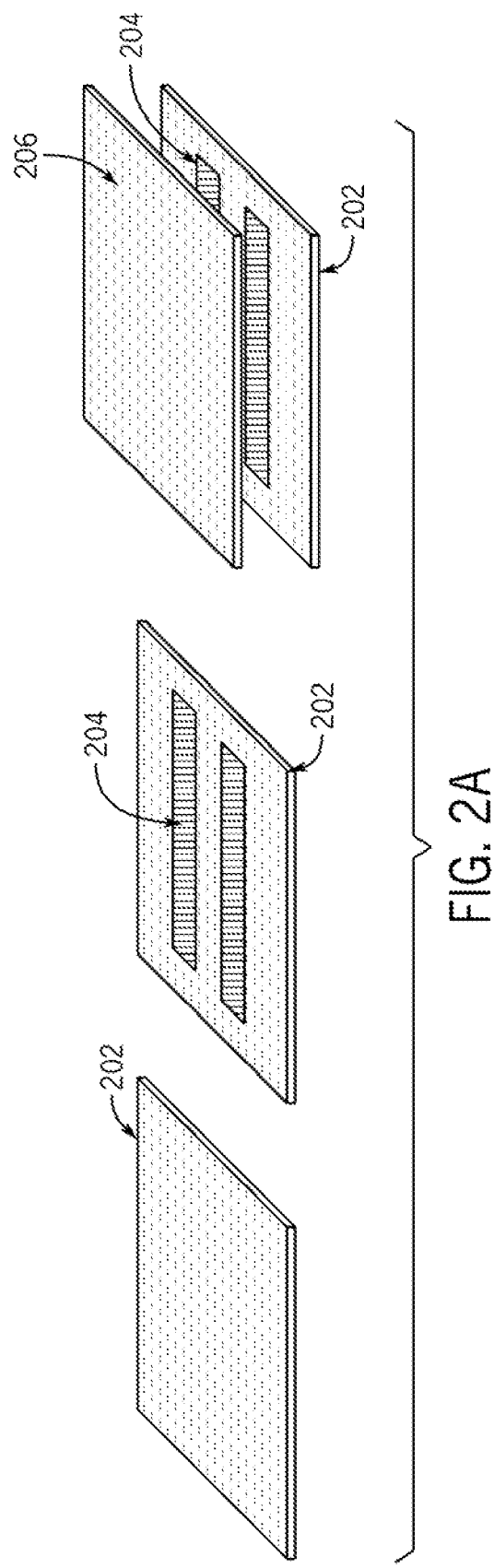
FIG. 2A is an illustrative overview of the fabrication of a top stretchable layer of the sensor substrate according to an exemplary embodiment of the present disclosure.

FIG. 2A is an illustrative overview of the fabrication of the top stretchable layer 102 of the sensor substrate 100 according to an exemplary embodiment of the present disclosure. As shown, a dielectric layer 202 may be cast as a bottom portion of the top stretchable layer 102. The dielectric layer 202 may be cast in a mold using an elastic material. Accordingly, the top portion of the top stretchable layer 102 may provide a level of elasticity and pliability that may be useful for various robotic sensing actions.

It is appreciated that a wide range of such materials available in the market that range in elastic modulus of 100 kPa (very soft) to 1~2 MPa (fairly rigid) may be utilized to cast the dielectric layer 202 of the top stretchable layer 102. Such materials may closely simulate the mechanical properties of human skin. For example, soft elastic materials such as Ecoflex, Dragon Skin, and the like may be utilized to cast the dielectric layer 202 of the top stretchable layer 102. In some configurations, the dielectric layer 202 may also have structures such as pillars, pyramids, or domes and therefore air gaps, to fine tune the mechanical properties as desired.

With continued reference to FIG. 2A, once the dielectric layer 202 is cast, the fabrication system may pattern the stretchable electrode material into a stretchable electrode pattern 204 with a material using a patterning process of choice. Non-limiting exemplary materials that may be used may include, but may not be limited to, carbon nanotubes, silver nanowires, conducting polymer and/or conducting particle composites. Non-limiting exemplary patterning processes that may be used, but may not be limited to, spray coating shadow masking, and/or screen printing.

In one embodiment, upon the patterning of the stretchable electrodes into the stretchable electrode pattern 204, an encapsulating layer 206 may be cast upon the stretchable electrode pattern 204 using the same or similar elastic material used to cast the dielectric layer 202 of the top stretchable layer 102. For example, the encapsulating layer 206 may be cast in a mold using Ecoflex, Dragon Skin, or other elastic materials.

Figure 2B:
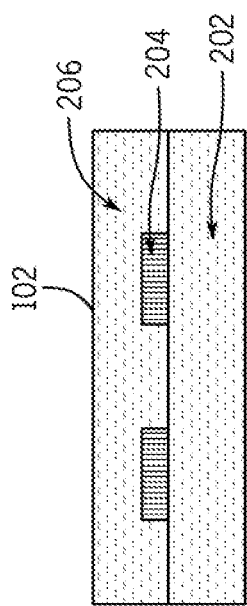
FIG. 2B is a cross-section view of the top stretchable layer of the sensor substrate according to an exemplary embodiment of the present disclosure.

As shown in FIG. 2B, a cross-section of the top stretchable layer 102 of the sensor substrate 100 according to an exemplary embodiment of the present disclosure, the encapsulating layer 206 is cast upon the stretchable electrode pattern 204. As discussed above, the stretchable electrode pattern 204 is disposed atop of the dielectric layer 202 that may be composed of elastic material.

Figure 3A:
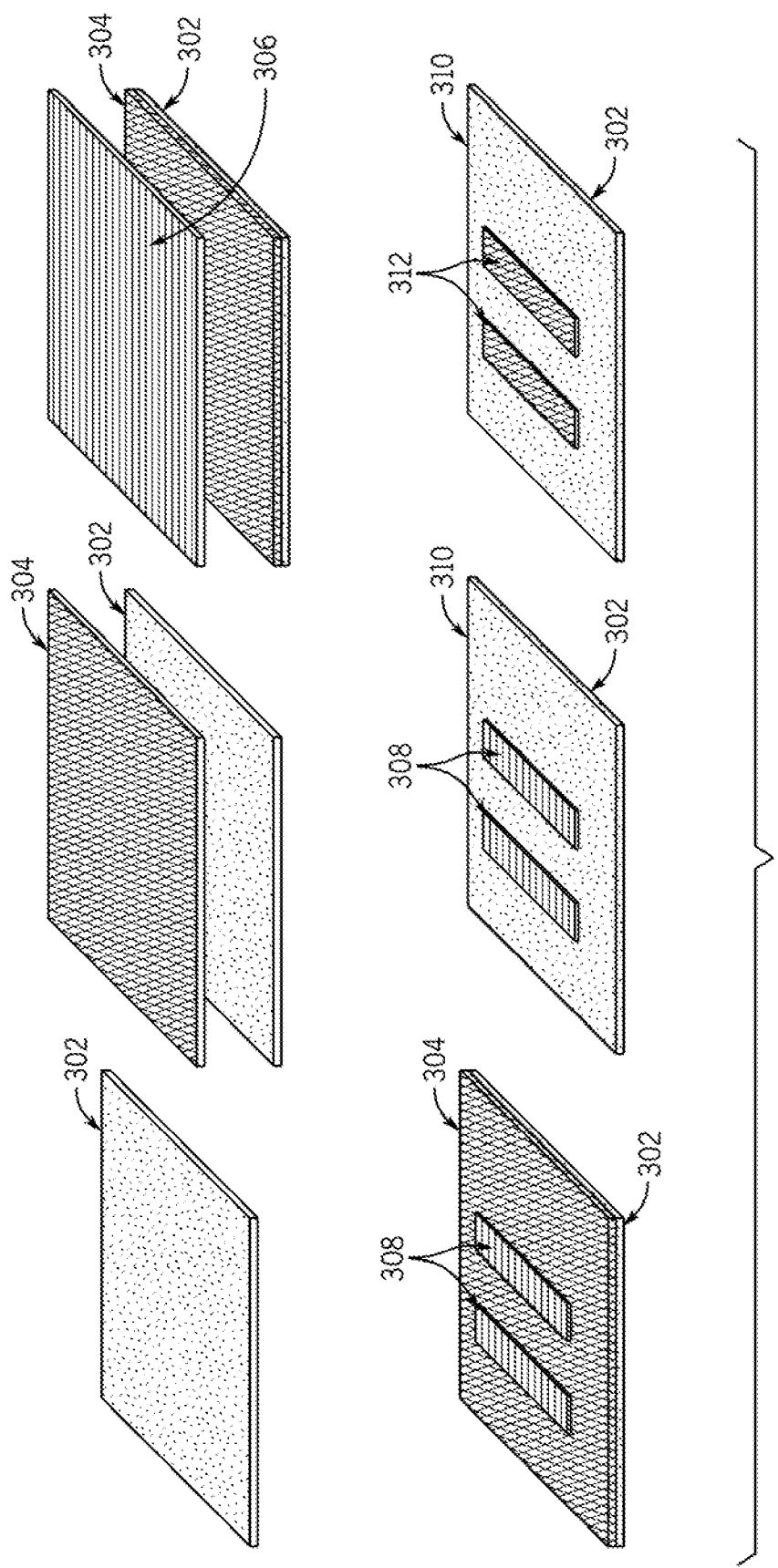
FIG. 3A is an illustrative overview of a bottom flexible layer of the sensor substrate according to an exemplary embodiment of the present disclosure.

With reference to the bottom flexible layer 104, of the sensor substrate 100, FIG. 3A includes an illustrative overview of the bottom flexible layer 104 of the sensor substrate 100 according to an exemplary embodiment of the present disclosure. In one embodiment, a bottom portion of the bottom flexible layer 104 and consequently the sensor substrate 100 may be configured as a soft adhesive sheet 302. In one configuration, the soft adhesive sheet 302 may be configured as a pliable adhesive sheet that may be flexible for robust adhesion to various arbitrary smooth geometries. The soft adhesive sheet 302 may be configured as a double sided acrylic tape sheet adhesive substrate. As an illustrative example, the soft adhesive sheet 302 may include tape dimensions of 12"×12". It is appreciated that many different sizes of sheets and tape dimensions may be utilized that may include varying properties of mechanical stiffness and chemical stability.

With continued reference to FIG. 3A, a thin sheet of copper film 304 may be laminated upon a top side portion of the soft adhesive sheet 302. Upon the lamination of the copper film 304 upon the soft adhesive sheet 302, a dry film photoresist 306 may be laminated upon a top portion of the copper film 304. In one configuration, the fabrication system may be configured to send instructions to utilize a thermal laminator (not shown) to laminate the dry film photoresist 306 upon the copper film 304. In one embodiment, the dry film photoresist 306 may be exposed through a mask using an ultraviolet source.

In an exemplary embodiment, the fabrication system may be configured to use a developing solution to develop exposed portions of dry film photoresist pattern 308. The exposed portions of dry film photoresist pattern 308 may be utilized as a mask to etch undesired portions of copper of the copper film 304 previously laminated upon the soft adhesive sheet 302. Accordingly, the soft adhesive sheet 302 may include etched copper 310 with respective exposed portions of dry film photoresist pattern 308 that remain upon the soft adhesive sheet 302.

In one embodiment, upon the etching of the undesired copper of the copper film 304 to allow the etched copper 310 to remain upon the soft adhesive sheet 302, the fabrication system may remove the photoresist from the dry film photoresist pattern 308 that remains upon the etched copper 310. Upon the removal of the photoresist, a patterned copper film may remain upon the etched copper 310 of the bottom flexible layer of a sensor substrate. The patterned copper film may be configured as patterned copper electrodes 312 that may be operably connected to a control board (not shown) that is associated with the sensor substrate 100.

Figure 3B:
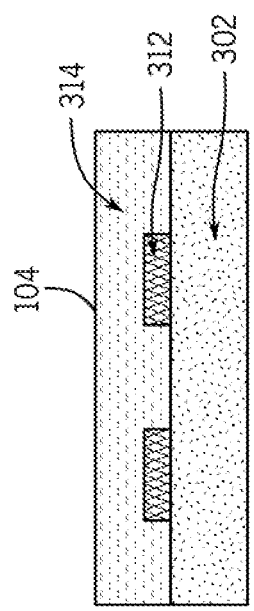
FIG. 3B is a cross-section view of the bottom flexible layer of the sensor substrate according to an exemplary embodiment of the present disclosure.

FIG. 3B is a cross-section view of the bottom flexible layer 104 of the sensor substrate 100 according to an exemplary embodiment of the present disclosure. In an exemplary embodiment, a top layer of elastic material 314 may be cast upon of the soft adhesive sheet 302 that may be configured as an adhesive substrate. As discussed above, the soft adhesive sheet 302 may include the patterned copper electrodes 312 that may remain upon the etched copper 310 of the bottom flexible layer 104 of the sensor substrate 100.

Figure 4:
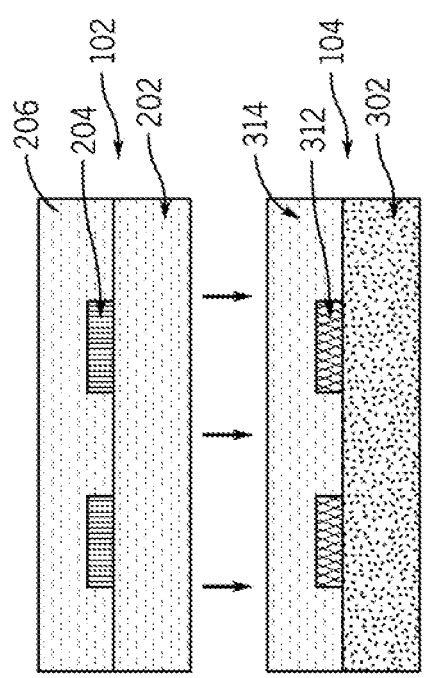
FIG. 4 is an illustrative overview of bonding of the top stretchable layer and the bottom flexible layer according to an exemplary embodiment of the present disclosure.

FIG. 4 includes an illustrative overview of the bonding of the top stretchable layer 102 and the bottom flexible layer 104 according to an exemplary embodiment of the present disclosure. In an exemplary embodiment, upon the fabrication of the top stretchable layer 102 of the sensor substrate 100 and the bottom flexible layer 104 of the sensor substrate 100, the fabrication system may be configured to bond the top stretchable layer 102 to the bottom flexible layer 104 to form the sensor substrate 100. As shown, the casting of the top layer of elastic material 314 upon the adhesive substrate of the bottom flexible layer 104 may enable a strong adhesion between the dielectric layer 202 that may be composed of elastic material and the layer of elastic material 314 of the bottom flexible layer 104. Accordingly, the top layer of elastic material 314 may be bonded to the bottom flexible layer 104 to form the sensor substrate 100.

Figure 5:
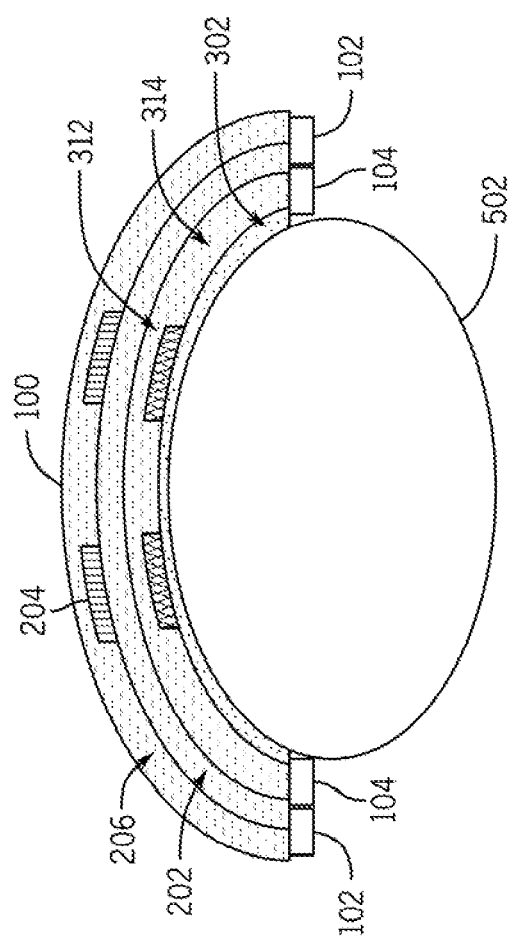
FIG. 5 is an illustrative overview of the bonding of the sensor substrate to an arbitrary smooth geometry according to an exemplary embodiment of the present disclosure.

FIG. 5 includes an illustrative overview of the bonding of the sensor substrate 100 to an arbitrary smooth geometry according to an exemplary embodiment of the present disclosure. As represented in FIG. 5, upon the fabrication of the sensor substrate 100, the bottom portion that is configured as a soft adhesive sheet 302 may be configured for robust adhesion to a robotic device such as a robot finger/hand 502. In other words, once the sensor fabrication is complete, the sensor substrate 100 which is adhesive on a bottom face is used to adhere the sensor substrate 100 on any arbitrary smooth geometry such as to the robot finger/hand 502. In order to interface with readout electronics, the patterned copper electrodes 312 may include traces that run to the circuit board that is associated with the sensor substrate 100. In one configuration, the traces may be soldered to consequently form a robust connection between the patterned copper electrodes 312 and the circuit board to communicate sensor signals.

In some embodiments, the patterned copper electrodes 312 may be interfaced with copper tape, using crimp connectors on each respective electrode connection trace, and/or using a flexible flat cable connection (exemplary connections not shown). In alternate embodiments, the copper tape and/or the flexible flat cable connection may be soldered on the circuit board. However, it is appreciated that various types of connection techniques may be utilized to operably interface the patterned copper electrodes 312 with the control board that is associated with the sensor substrate 100.

The fabrication system may enable a reduction of the number of interconnects requiring a soft electrode-rigid circuit interface by at least half or even more in case of an asymmetric circuit to enhance the signal integrity by a significant amount. In some configurations, if the sense terminals of the readout hardware are connected using the copper soldered connection, this functionality may provide an additional increase in signal to noise ratio. The utilization of photolithography may enable the fabrication of very complex and dense bottom electrode patterns in asymmetric designs where only one set of electrode patterns need to be more complex than the other.

In one embodiment, a stretchable conductor material with electrode materials (such as copper) may be utilized to achieve a higher signal integrity by moving one half or more of the sensor(s) into the solid electrode material domain. The connection of excitation terminals of the readout electronics to the top stretchable layer 102 and the sense terminals to the patterned copper electrodes 312 of the bottom flexible layer 104 is thereby completed. This functionality ensures a higher signal integrity and clean sense signal which delivers a better signal to noise ratio, when compared to a sensor that has both top and bottom electrodes made of stretchable conductor materials.

Figure 6:
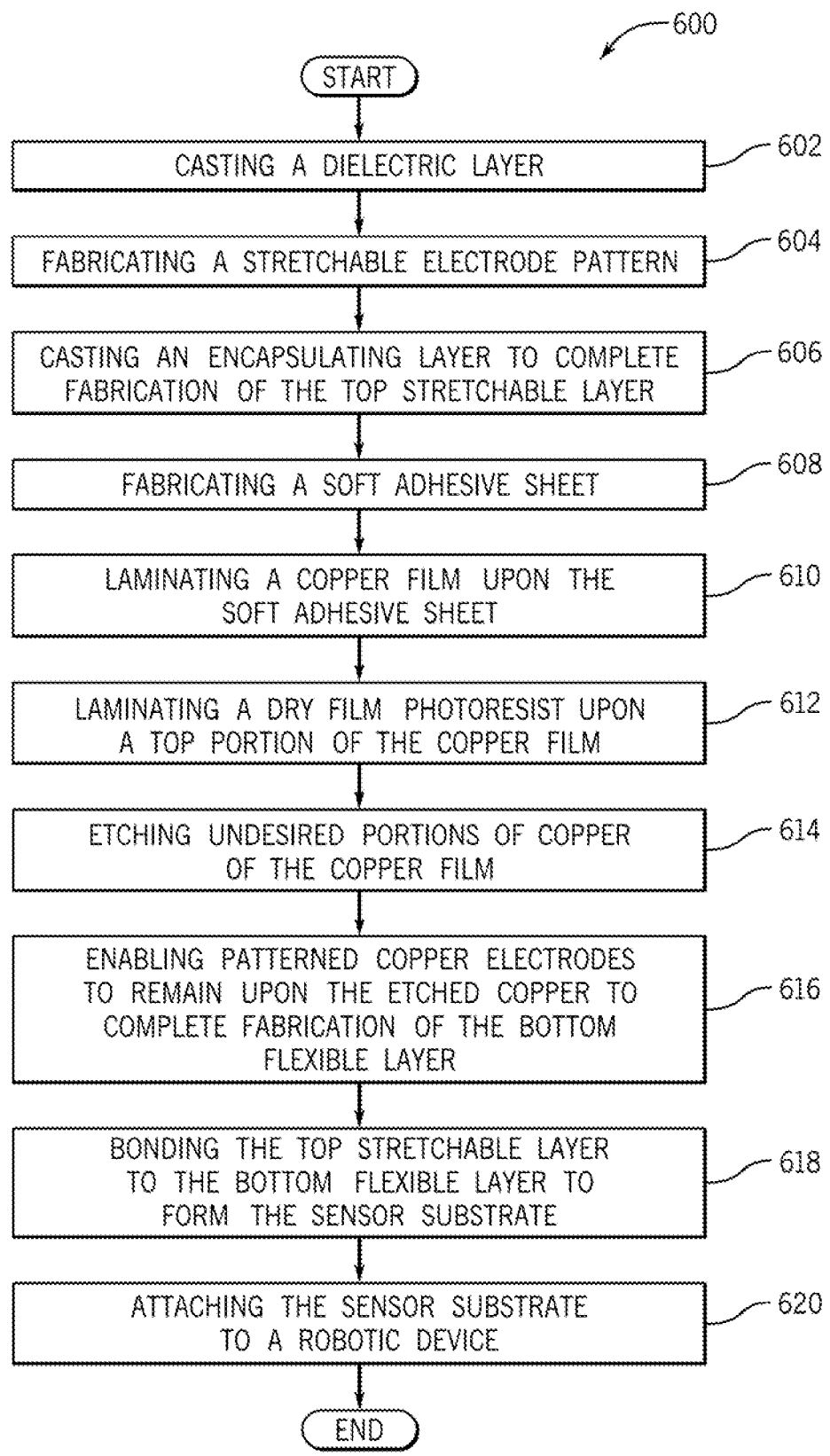
FIG. 6 is a process flow diagram of a method for fabricating the sensor substrate and attaching the sensor substrate to a robotic device according to an exemplary embodiment of the present disclosure.

II. Methods Implemented to Fabricate Soft Sensors that Confirm to Arbitrary Geometries FIG. 6 is a process flow diagram of a method 600 for fabricating the sensor substrate 100 and attaching the sensor substrate 100 to a robotic device according to an exemplary embodiment of the present disclosure. FIG. 6 will be described with reference to the components of FIG. 1-FIG. 5 though it is to be appreciated that the method 600 of FIG. 6 may be used with other systems/components. In one embodiment, the method 600 may be included as computer implemented instructions that are stored within an electronic memory and may be accessed and executed by a processor of a computing system to operably control mechanical equipment (e.g., machinery) to fabricate the top stretchable layer 102 of the sensor substrate 100 and the bottom flexible layer 104 of the sensor substrate 100, and to attach the bonded layers that comprise the sensor substrate 100 to a robotic device.

The method 600 may begin at block 602, wherein the method 600 may include casting a dielectric layer 202. In one embodiment, the fabrication system may begin the fabrication process to fabricate the top stretchable layer 102 of the sensor substrate 100 by casting the dielectric layer 202 as a bottom portion of the top stretchable layer 102. As discussed above, the dielectric layer 202 may be cast in a mold using an elastic material. In some configurations, the dielectric layer 202 may have structures such as pillars, pyramids or domes to fine tune mechanical properties as desired.

The method 600 may proceed to block 604, wherein the method 600 may include fabricating a stretchable electrode pattern 204. In one embodiment, the fabrication system may fabricate the stretchable electrode pattern 204 with a material of choice using a patterning process of choice. For example, spray coating, shadow mask, and/or screen printing may be utilized to pattern carbon nanotubes, silver nanowires, conducting polymer and/or conducting particle composites as materials of the stretchable electrode pattern 204.

The method 600 may proceed to block 606, wherein the method 600 may include casting an encapsulating layer 206 to complete fabrication of the top stretchable layer 102. In one embodiment, the encapsulating layer 206 may be cast upon the stretchable electrode pattern 204 using the same or similar elastic material used to cast the dielectric layer 202 of the top stretchable layer 102. Accordingly, as shown in FIG. 2B, the encapsulating layer 206 may be cast atop the stretchable electrode pattern 204 which is included upon the dielectric layer 202 to complete fabrication of the top stretchable layer 102.

The method 600 may proceed to block 608, wherein the method 600 may include fabricating a soft adhesive sheet 302. In one embodiment, the fabrication system may begin the fabrication process to fabricate the bottom flexible layer 104 of the sensor substrate 100 by fabricating the soft adhesive sheet 302 as a bottom portion of the bottom flexible layer 104. The soft adhesive sheet 302 may be configured as a double sided acrylic tape sheet that is configured with varying properties of mechanical stiffness and chemical stability.

The method 600 may proceed to block 610, wherein the method 600 may include laminating a copper film 304 upon the soft adhesive sheet 302. In one embodiment, the fabrication system may laminate the thin sheet of copper film 304 upon a top side portion of the soft adhesive sheet 302. In one embodiment, the copper film 304 may be patterned using photolithography. This may enable the fabrication of passive electronic components such as surface mount resistors directly on the circuit board associated with the sensor substrate 100. This functionality enables the ability to design complex electrode designs which otherwise may not be possible to fabricate using alternative processes such as shadow mask patterning of composites.

The method 600 may proceed to block 612, wherein the method 600 may include laminating a dry film photoresist 306 upon a top potion of the copper film 304. Upon the lamination of the copper film 304 upon the soft adhesive sheet 302, the fabrication system may utilize a thermal laminator to laminate a dry film photoresist 306 upon a top portion of the copper film 304.

The method 600 may proceed to block 614, wherein the method 600 may include etching undesired portions of copper of the copper film 304. In an exemplary embodiment, the fabrication system may utilize the exposed portions of dry film photoresist pattern 308 as a mask to etch undesired portions of copper of the copper film 304 previously laminated upon the soft adhesive sheet 302. Accordingly, the soft adhesive sheet 302 may include the etched copper 310 with respective portions of dry film photoresist 306 that remain upon the soft adhesive sheet 302.

The method 600 may proceed to block 616, wherein the method 600 may include enabling patterned copper electrodes to remain upon the etched copper 310 to complete fabrication of the bottom flexible layer 104. In one embodiment, the fabrication system may remove the photoresist, leaving the patterned copper electrodes 312. The patterned copper electrodes 312 may include traces that run to the circuit board that is associated with the sensor substrate 100. Accordingly, as shown in FIG. 3B, the bottom flexible layer 104 may be fabricated with the soft adhesive sheet 302 that includes the patterned copper electrodes 312 that are included upon the etched copper 310. The bottom flexible layer 104 may be configured to be in conformity with the arbitrary smooth geometries with smooth segments of small radii of curvatures, to which a high level of conformity may be achieved with a suitable copper film thickness and copper pattern size and shape.

The method 600 may proceed to block 618, wherein the method 600 may include bonding the top stretchable layer 102 to the bottom flexible layer 104 to form the sensor substrate 100. In one embodiment, upon the fabrication of the top stretchable layer 102 of the sensor substrate 100 (at block 606) and the bottom flexible layer 104 of the sensor substrate 100 (at block 616), the fabrication system may be configured to bond the top stretchable layer 102 to the bottom flexible layer 104 to form the sensor substrate 100. In one embodiment, the top layer of elastic material 414 may include an adhesive coating that may enable a strong adhesion between the dielectric layer 202 of the top stretchable layer 102 and the layer of elastic material 414 of the bottom flexible layer 104. Accordingly, the top stretchable layer 102 may be bonded to the bottom flexible layer 104 to form the sensor substrate 100.

The method 600 may proceed to block 620, wherein the method 600 may include attaching the sensor substrate 100 to a robotic device. In an exemplary embodiment, upon the completion of the sensor fabrication, the sensor substrate 100, which is adhesive on the bottom face may be placed upon any arbitrary geometry to be robustly adhered to the arbitrary geometry. As discussed above with respect to FIG. 5, once the sensor fabrication is complete, the sensor substrate 100 which is adhesive on a bottom face is used to adhere the sensor substrate 100 on any arbitrary smooth geometry such as to the robot finger/hand 502.

Since the fabrication system utilizes the soft adhesive sheet 302 as the base of the sensor substrate 100, robust adhesion arbitrary smooth geometry such as to the robot finger/hand 502 is achieved with little risk of delamination as the robotic device interacts with the physical world. Additionally, this functionality also ensures robust adhesion of the patterned copper electrodes 312 on the sensor substrate 100 and also the top elastic layers that are built upon it.

Figure 7:
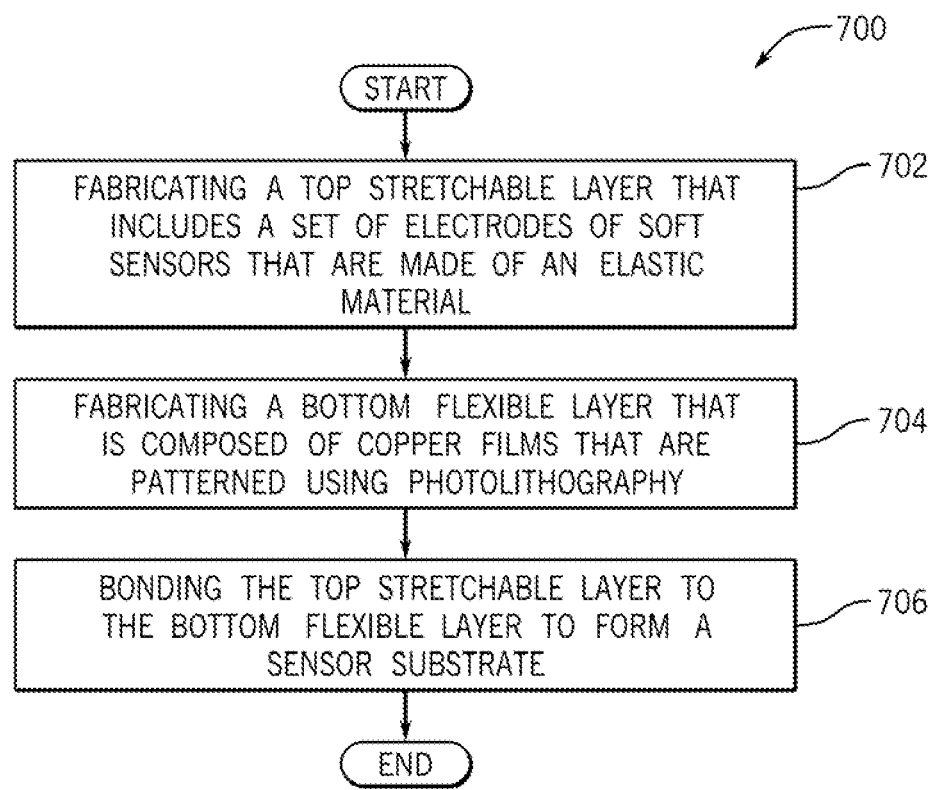
FIG. 7 is a process flow diagram of a method for fabricating soft sensors that conform to arbitrary smooth geometries according to an exemplary embodiment of the present disclosure.

FIG. 7 is a process flow diagram of a method for fabricating soft sensors that conform to arbitrary smooth geometries according to an exemplary embodiment of the present disclosure. FIG. 7 will be described with reference to the components of FIG. 1-FIG. 5 though it is to be appreciated that the method 700 of FIG. 7 may be used with other systems/components. The method 700 may begin at block 702, wherein the method 700 may include fabricating a top stretchable layer 102 that includes a set of electrodes of soft sensors that are made of an elastic material.

The method 700 may proceed to block 704, wherein the method 700 includes fabricating a bottom flexible layer 104 that is composed of copper films that are patterned using photolithography. In one embodiment, the bottom flexible layer 104 is configured to be in conformity with the arbitrary smooth geometries. The method 700 may proceed to block 706, wherein the method 700 includes bonding the top stretchable layer 102 to the bottom flexible layer 104 to form a sensor substrate 100. In one embodiment, the sensor substrate 100 is configured as a stretchable adhesive film which enables robust adhesion to the arbitrary smooth geometries.

It should be apparent from the foregoing description that various exemplary embodiments of the disclosure may be implemented in hardware. Furthermore, various exemplary embodiments may be implemented as instructions stored on a non-transitory machine-readable storage medium, such as a volatile or non-volatile memory, which may be read and executed by at least one processor to perform the operations described in detail herein. A machine-readable storage medium may include any mechanism for storing information in a form readable by a machine, such as a personal or laptop computer, a server, or other computing device. Thus, a non-transitory machine-readable storage medium excludes transitory signals but may include both volatile and non-volatile memories, including but not limited to read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

It will be appreciated that various implementations of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A system for fabricating soft sensors that conform to arbitrary smooth geometries comprising:
a top stretchable layer that includes a set of electrodes of soft sensors that are made of an elastic material; and
a bottom flexible layer that is composed of a thin sheet of suitable metal that is patterned using photolithography, wherein the bottom flexible layer is configured to be in conformity with the arbitrary smooth geometries, wherein the top stretchable layer is bonded to the bottom flexible layer to form a sensor substrate, wherein the sensor substrate is configured as a stretchable adhesive film which enables robust adhesion to the arbitrary smooth geometries.

2. The system of claim 1, wherein the top stretchable layer includes a dielectric layer of the top stretchable layer that is cast in a mold using the elastic material.

3. The system of claim 2, wherein the set of electrodes is configured in a pattern and disposed atop of the dielectric layer of the top stretchable layer as a stretchable electrode.

4. The system of claim 3, wherein the top stretchable layer includes an encapsulating layer that is cast upon the stretchable electrode.

5. The system of claim 1, wherein the bottom flexible layer includes a soft adhesive sheet of the bottom flexible layer that is configured with surfaces that include adhesive properties.

6. The system of claim 5, wherein fabricating the bottom flexible layer includes the thin sheet of suitable metal that is laminated upon the soft adhesive sheet of the bottom flexible layer.

7. The system of claim 6, wherein a photoresist is laminated upon a copper film, wherein the photoresist is exposed through a mask using an ultraviolet source.

8. The system of claim 7, wherein etched copper with portions of the dry film photoresist remain upon the soft adhesive sheet of the bottom flexible layer upon etching of undesired copper of the copper film.

9. The system of claim 8, wherein the arbitrary smooth geometries includes at least one of: a robot finger and a palm.

10. A method for fabricating soft sensors that conform to arbitrary smooth geometries comprising:
fabricating a top stretchable layer that includes a set of electrodes of soft sensors that are made of an elastic material;
fabricating a bottom flexible layer that is composed of a thin sheet of suitable metal that is patterned using photolithography, wherein the bottom flexible layer is configured to be in conformity with the arbitrary smooth geometries; and
bonding the top stretchable layer to the bottom flexible layer to form a sensor substrate, wherein the sensor substrate is configured as a stretchable adhesive film which enables robust adhesion to the arbitrary smooth geometries.

11. The method of claim 10, wherein fabricating the top stretchable layer includes casting a dielectric layer of the top stretchable layer in a mold using the elastic material.

12. The method of claim 11, wherein the set of electrodes is configured in a pattern and disposed atop of the dielectric layer of the top stretchable layer as a stretchable electrode, wherein an encapsulating layer is cast upon the stretchable electrode.

13. The method of claim 11, wherein fabricating the bottom flexible layer includes providing a soft adhesive sheet of the bottom flexible layer that is configured with surfaces that include adhesive properties.

14. The method of claim 13, wherein fabricating the bottom flexible layer includes laminating the thin sheet of suitable metal upon the soft adhesive sheet of the bottom flexible layer.

15. The method of claim 14, wherein fabricating the bottom flexible layer includes laminating a photoresist upon a copper film, wherein the photoresist is exposed through a mask using an ultraviolet source.

16. The method of claim 15, wherein fabricating the bottom flexible layer includes etching undesired copper of the copper film, wherein etched copper with portions of the dry film photoresist remain upon the soft adhesive sheet of the bottom flexible layer.

17. A system for fabricating soft sensors that conform to arbitrary smooth geometries comprising:
a sensor substrate that is configured to as a stretchable adhesive film which enables robust adhesion to a robotic device that includes:
a top stretchable layer that includes a set of electrodes of soft sensors that are made of an elastic material; and
a bottom flexible layer that is composed of copper films that are patterned using photolithography.

18. The sensor substrate of claim 17, wherein the top stretchable layer includes a dielectric layer of the top stretchable layer, wherein the dielectric layer includes the set of electrodes that are configured in a pattern as a stretchable electrode, wherein the top stretchable layer includes an encapsulating layer that is cast upon the stretchable electrode.

19. The sensor substrate of claim 18, wherein the bottom flexible layer includes a thin sheet of copper film that is laminated upon the soft adhesive sheet of the bottom flexible layer, a dry film photoresist that is laminated upon the thin sheet of copper film, and etched copper that is disposed upon the soft adhesive sheet of the bottom flexible layer.

20. The sensor substrate of claim 19, wherein the soft adhesive sheet of the bottom flexible layer adheres to the robotic device allowing the sensor substrate to be bonded to the robotic device.

* * * * *